(12) United States Patent
Hawryluk et al.

(10) Patent No.: US 8,765,493 B2
(45) Date of Patent: Jul. 1, 2014

(54) METHODS OF CHARACTERIZING SEMICONDUCTOR LIGHT-EMITTING DEVICES BASED ON PRODUCT WAFER CHARACTERISTICS

(71) Applicants: Andrew M. Hawryluk, Los Altos, CA (US); David Owen, Redondo Beach, CA (US)

(72) Inventors: Andrew M. Hawryluk, Los Altos, CA (US); David Owen, Redondo Beach, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 13/681,994

(22) Filed: Nov. 20, 2012

(65) Prior Publication Data

US 2014/0141538 A1    May 22, 2014

(51) Int. Cl.
*H01L 21/00* (2006.01)

(52) U.S. Cl.
USPC ............................................................ 438/7

(58) Field of Classification Search
USPC ............................................................. 438/7
See application file for complete search history.

(56) References Cited

U.S. PATENT DOCUMENTS

| | | | |
|---|---|---|---|
| 6,489,801 B1 * | 12/2002 | Borden et al. | 324/754.22 |
| 6,600,565 B1 * | 7/2003 | Suresh et al. | 356/521 |
| 6,734,959 B2 | 5/2004 | Griffiths et al. | |
| 6,924,497 B2 | 8/2005 | Suresh et al. | |
| 7,266,800 B2 | 9/2007 | Sezginer | |
| 7,363,173 B2 * | 4/2008 | Rosakis et al. | 702/42 |
| 7,487,050 B2 * | 2/2009 | Rosakis et al. | 702/42 |
| 7,700,413 B2 | 4/2010 | Kusunoki | |
| 8,110,423 B2 | 2/2012 | Okabe | |
| 8,318,516 B2 | 11/2012 | Chen | |
| 8,476,918 B2 | 7/2013 | Huang | |
| 8,486,726 B2 * | 7/2013 | Mangum et al. | 438/14 |
| 2002/0021452 A1 | 2/2002 | Park et al. | |
| 2008/0199978 A1 | 8/2008 | Fu et al. | |

(Continued)

FOREIGN PATENT DOCUMENTS

| | | |
|---|---|---|
| JP | H05-129454 A | 5/1993 |
| JP | 2006-156454 A | 5/2006 |
| JP | 2008266064 | 11/2008 |
| JP | 2010-177620 A | 8/2010 |

OTHER PUBLICATIONS

Search Report from Hungarian Intellectual Property Office (as provided to the Singapore Intellectual Property Office) for Singapore Patent Application No. 201208669-0, which is a counterpart to the above-identified patent application, Jun. 2013.

(Continued)

*Primary Examiner* — Lex Malsawma
(74) *Attorney, Agent, or Firm* — Opticus IP Law PLLC

(57) ABSTRACT

Methods of characterizing semiconductor light-emitting devices (LEDs) based on product wafer characteristics are disclosed. The methods include measuring at least one product wafer characteristic, such curvature or device layer stress. The method also includes establishing a relationship between the at least one characteristic and the emission wavelengths of the LED dies formed from the product wafer. The relationship allows for predicting the emission wavelength of LED structures formed in the device layer of similarly formed product wafers. This in turn can be used to characterize the product wafers and in particular the LED structures formed thereon, and to perform process control in high-volume LED manufacturing.

22 Claims, 9 Drawing Sheets

(56) References Cited

U.S. PATENT DOCUMENTS

2008/0316442 A1 12/2008 Adel et al.
2009/0057690 A1 3/2009 Chakraborty
2009/0309191 A1 12/2009 Theuss
2010/0155750 A1 6/2010 Donofrio
2012/0326060 A1 12/2012 Kenane
2013/0046496 A1 2/2013 Chen

OTHER PUBLICATIONS

Jang et al., "Measurement of nonuniform bowing in GaN/sapphire epi-wafers and subsequent stress analysis by using a theoretical model," Proc. SPIE, vol. 7939, Feb. 18, 2011.
First Office Action from Japanese Patent Office for Japanese Patent Application No. JP2012-249254.

* cited by examiner

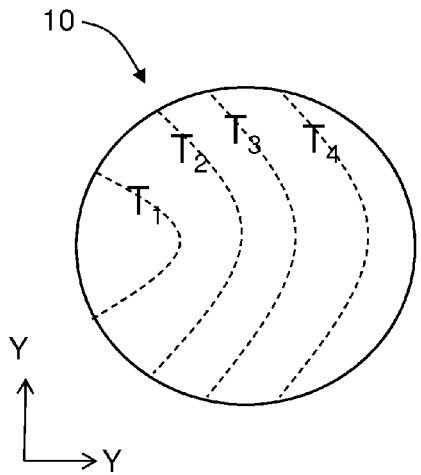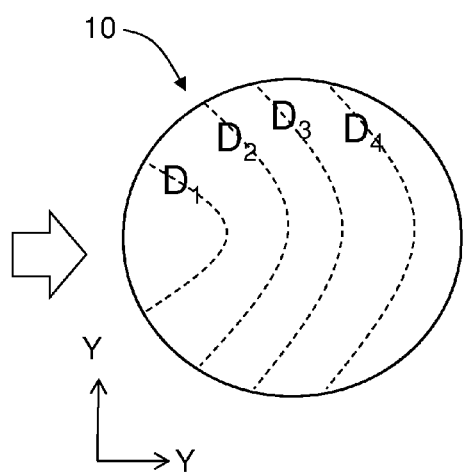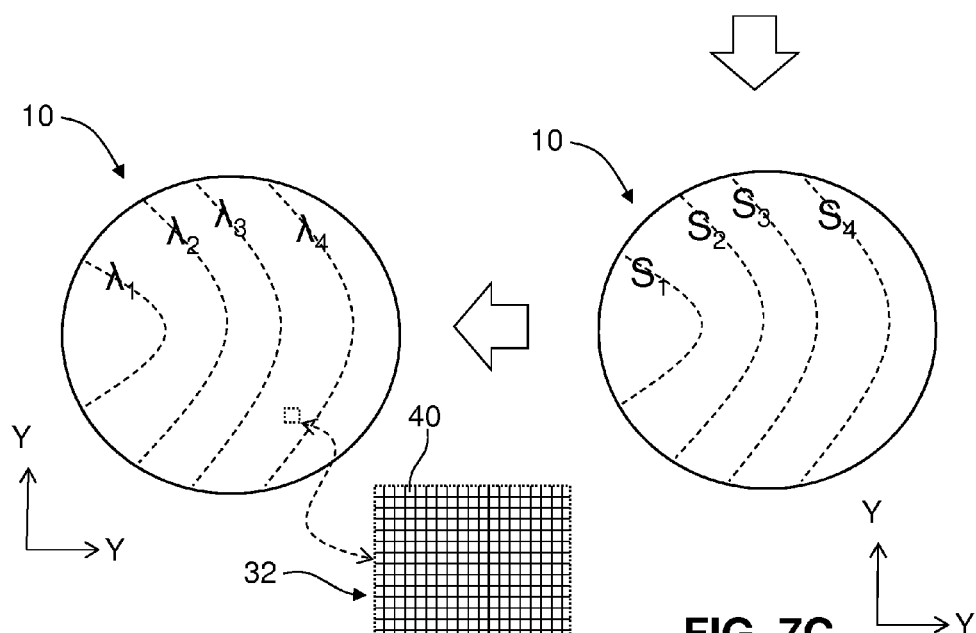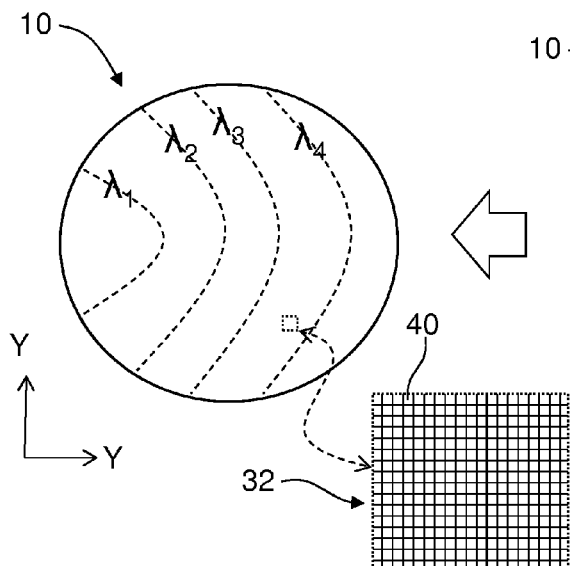
FIG. 7A
FIG. 7B
FIG. 7C
FIG. 7D

METHODS OF CHARACTERIZING SEMICONDUCTOR LIGHT-EMITTING DEVICES BASED ON PRODUCT WAFER CHARACTERISTICS

CLAIM OF PRIORITY

This Application claims priority from U.S. Provisional Patent Application Ser. No. 61/567,820, filed on Dec. 7, 2011, which Application is incorporated by reference herein.

FIELD

The present disclosure relates generally to the manufacturing of semiconductor light-emitting devices (LEDs) such as light-emitting diodes and laser diodes, and in particular to a method of characterizing semiconductor LEDs based on product wafer characteristics.

BACKGROUND ART

Semiconductor LEDs such as light-emitting diodes and laser diodes are fast replacing conventional light sources in virtually the entire range of light and illumination applications. As a consequence, they are being manufactured in ever increasing numbers for a very wide range of emitted wavelengths.

Example semiconductor LEDs for general lighting are light-emitting diodes (also called "LEDs") and diode lasers. A phosphor coating can be used to create a "white" light spectrum. The phosphor reacts with a specific emission wavelength of the device (e.g., a blue wavelength) and Stokes shifts a portion of the emission light from shorter to longer wavelengths to give the output light its white spectrum. A white spectrum can be characterized by an equivalent color temperature associated with the emitted light spectrum of the corresponding black-body radiation. A white-light spectrum that is "warm" is characterized by a color temperature of approximately 2800° K, whereas a "cold" white-light spectrum has a color temperature of approximately 5000° K. In a large number of applications, a warm while-light spectrum is preferred.

To obtain the proper color temperature, the emission wavelength $\lambda_E$ of the semiconductor light-emitting device needs to be matched to the absorption and emission spectrum $\Delta\lambda$ of the phosphor. Typically, the actual emission wavelength $\lambda_E$ needs to be within +/−2 nm of the desired (select) emitted wavelength $\lambda_{ED}$ to properly match with the phosphor absorption and emission characteristics. Properly matched, the LED lighting fixture provides a "white light" with a color temperature around 2800° K. Devices that fall outside of the particular wavelength specification have considerably less value because they produce light that is "off-color" and hence less desirable by the consumer. An LED manufacturer will often sell these "off-color" LEDs into a less-color-critical application, such as a flashlight, or exterior parking-garage facility. However, the value of these LEDs is much less than those sold to the general household illumination market, where the color temperature is critical. For this reason, the LED manufacturer strives to manufacture more LEDs per wafer that are within the more-valuable spectral range.

For optimum yield and hence optimum value and profit, it is desirable to fabricate the semiconductor light-emitting devices so that they have an accurate emission wavelength to within a specified tolerance. It is also desirable to be able to know beforehand the emission wavelength of the light-emitting chip (die) that goes into the final semiconductor light-emitting device during the manufacturing process.

SUMMARY

Methods of characterizing semiconductor light-emitting devices (LEDs) based on product wafer characteristics are disclosed. The methods include measuring at least one product wafer characteristic, such curvature or device layer stress. The method also includes establishing a relationship between the at least one characteristic and the emission wavelengths of the LED dies formed from the product wafer. The relationship allows for predicting the emission wavelength of LED structures formed in the device layer of similarly formed product wafers. This in turn can be used to characterize the product wafers and perform process control in high-volume LED manufacturing.

In accordance with an aspect of the present invention, a method includes establishing a relationship between a device-layer stress $S(x,y)$ and the emission wavelength $\lambda_E(x,y)$ for the device structures formed on the product wafer by measuring the device-layer stress $S(x,y)$ of a test product wafer, dicing the test product wafer to form dies, and measuring the emission wavelengths of the dies as a function of their device-layer stress and corresponding device structure locations (x,y). The method further includes measuring a change in curvature $\Delta C(x,y)$ of the test product wafer based on curvature measurements of the substrate performed before and after substrate processing to form the device structures. The method also includes calculating the device-layer stress $S(x,y)$ in the test product wafer based on the measured changed in curvature $\Delta C$. And the method further includes associating the actual emission wavelength $\lambda_E$ with the device structures based on the relationship between the device-layer stress $S(x,y)$ and the (x,y) positions on the test product wafer to establish a predicted emission wavelength for the device structures that corresponds to the emission wavelength $\lambda_E$.

The method preferably further includes calculating the stress $S(x,y)$ in the test product wafer based on the measured changed in curvature $\Delta C$ via the relationship $$S(x,y) = \{M_S h_S^2 / 6 h_F\} \Delta C(x,y)$$

where $M_S$ is a biaxial modulus of the substrate 20, $h_S$ is a height of the substrate, $h_F$ is a thickness the device structures.

In the method, the device structures may have either a light-emitting diode or laser diode configuration.

The method preferably further includes establishing a desired emission wavelength, dicing the product wafer to form dies from the device structures, and culling the dies based on the predicted emission wavelength.

The method preferably further includes defining a tolerance on an amount of variation in the emission wavelength and comparing the predicted emission wavelengths to the tolerance and determining from the comparison a course of action that includes either scrapping the product wafer, reworking the product wafer, or using a select portion of the product wafer.

In the method, the substrate processing may include performing a metalorganic chemical vapor deposition (MOCVD) process.

Another aspect of the disclosure is a method of characterizing an emission wavelength of a semiconductor light-emitting device (LED) structure of a product wafer having a substrate and a device layer. The method includes measuring at least one characteristic of a test product wafer formed in substantially the same manner as the product wafer, wherein the at least one characteristic is selected from the group of characteristics comprising: device layer stress and product wafer curvature. The method also includes dicing the at least one test product wafer to form LED dies that have associated therewith a position on the test product wafer. The method also includes measuring an LED emission wavelength for each the LED dies to establish a set of LED emission wavelengths that vary with position on the product wafer. The method further includes determining a relationship between the at least one test product wafer characteristic, the set of LED emission wavelengths, and the positions of the LED dies and using the relationship determined in act "determining a relationship" to predict the LED emission wavelength of the LED structures formed on the product wafer.

The method preferably includes binning the LED structures of the product wafer based on the relationship in act "determining a relationship".

In the method, the product wafer preferably includes a substrate. And the method preferably further includes measuring a curvature of the substrate prior to forming the product wafer.

The method preferably further includes measuring at least one of the substrate curvature and product wafer curvature using coherent gradient sensing (CGS).

In the method, the device structures may have a dimension. And the method preferably includes determining the at least one test product wafer characteristic to a dimension that is substantially equal to or less than the device structure dimension.

Another aspect of the disclosure is a method of forming semiconductor light-emitting devices (LEDs). The method includes forming a product wafer comprising LED structures formed on a substrate by a process having one or more process variables, with the substrate having a known initial curvature $C_0(x,y)$ prior to forming the LED structures thereon. The method further includes measuring a curvature $C(x,y)$ of the product wafer after forming the light-emitting device structures thereon, and determining a change in curvature $\Delta C(x,y)=C(x,y)-C_0(x,y)$. The method further includes calculating a stress $S(x,y)$ in the product wafer based on the measured changed in curvature $\Delta C(x,y)$. The method further includes associating an emission wavelength $\lambda_E$ of the LED structures with the calculated stress $S(x,y)$ based on a relationship between the calculated stress $S(x,y)$ and $(x,y)$ positions of the light-emitting device structures on the product wafer. And the method further includes comparing the emission wavelength $\lambda_E$ to an emission-wavelength variation tolerance and binning the LED structures into one or more bins based on the tolerance.

The method preferably further includes using only LED structures in one or more select bins to form LED devices.

The method preferably further includes adjusting at least one of the one or more process variables to reduce an amount of emission wavelength variation in the light-emitting device structures as a function of the (x,y) positions of the light-emitting device structures on the product wafer.

In the method, the process variables preferably be selected from the set of process variables comprising: time, temperature, temperature uniformity, partial gas pressure, partial gas pressure uniformity, gas flow rate and gas flow uniformity.

The method preferably further includes making curvature measurements of one or more test product wafers formed in the same manner as the product wafer, dicing the one or more test product wafers to form LED dies, and measuring emission wavelengths of the LED dies a function of their (x,y) position on the one or more test product wafers to the measured text product wafer curvature to the emission wavelengths.

The method preferably further includes forming a new product wafer, measuring the curvature of the new product wafer, and determining LED emission wavelengths of LED structures on the new product wafer based on the measured curvature of the new product wafer.

Another aspect of the disclosure is a method of forming semiconductor light-emitting devices (LEDs). The method includes forming a product wafer comprising LED structures formed on a semiconductor substrate by a process having one or more process variables, measuring a curvature uniformity of the product wafer after forming the LED structures thereon, and adjusting at least one of the one or more process variables to meet at least one of a curvature uniformity requirement and a stress uniformity requirement.

Another aspect of the disclosure is a method of forming a semiconductor light-emitting device (LED). The method includes forming a product wafer comprising LED structures formed on a substrate by a process having one or more process variables, with the substrate having known initial curvature $C_0(x,y)$ prior to forming the light-emitting device structures thereon. The method also includes measuring a curvature $C(x,y)$ of the product wafer after forming the light-emitting device structures thereon, and determining a curvature uniformity based on $C_0(x,y)$ and $C(x,y)$. The method also includes determining a first number of die that fall within a first range of curvature uniformity. The method also includes determining a second number of die that fall within a second range of curvature uniformity. The method also includes assigning a quality value for the product wafer based on the first and second numbers.

The method preferably further includes dispositioning the product wafer based on the assigned quality value.

The method preferably further includes dicing the product wafer to form LED dies associated with the first and second numbers. The method preferably further includes using the LED dies associated with the first number for a first application and using the LED dies associated with the second number for a second application.

Another aspect of the disclosure is a method of forming semiconductor light-emitting devices. The method includes forming a product wafer comprising light-emitting device structures formed on a substrate by a process having one or more process variables, with the substrate having known initial curvature $C_0(x,y)$ prior to forming the light-emitting device structures thereon. The method also includes measuring a curvature $C(x,y)$ of the product wafer after forming the light-emitting device structures thereon, and determining a change in curvature $\Delta C(x,y)=C(x,y)-C_0(x,y)$. The method also includes associating an emission wavelength $\lambda_E$ of the light-emitting device structures with the calculated wafer curvature $C(x,y,)$ based on a relationship between the calculated curvature $C(x,y)$ and (x,y) positions of the light-emitting device structures on the product wafer. And the method also includes comparing the emission wavelength $\lambda_E$ to an emission-wavelength variation tolerance to determine which light-emitting structures can be used to form a light-emitting device.

Additional features and advantages of the disclosure are set forth in the detailed description that follows, and in part will be readily apparent to those skilled in the art from that description or recognized by practicing the disclosure as described herein, including the detailed description that follows, the claims, and the appended drawings. The claims are incorporated into and constitute part of the detailed description of the disclosure.

It is to be understood that both the foregoing general description and the following detailed description present embodiments of the disclosure and are intended to provide an overview or framework for understanding the nature and character of the disclosure as it is claimed. The accompanying drawings are included to provide a further understanding of the disclosure and are incorporated into and constitute a part of this specification. The drawings illustrate various embodiments of the disclosure and together with the description serve to explain the principles and operations of the disclosure.

BRIEF DESCRIPTION OF THE DRAWINGS

FIGS. 7A through 7D are plan views of a product wafer illustrating contours that show variations in the product wafer temperature T, device dimension D, device-layer stress S and emission wavelength $\lambda_E$, respectively;

Figure 1:
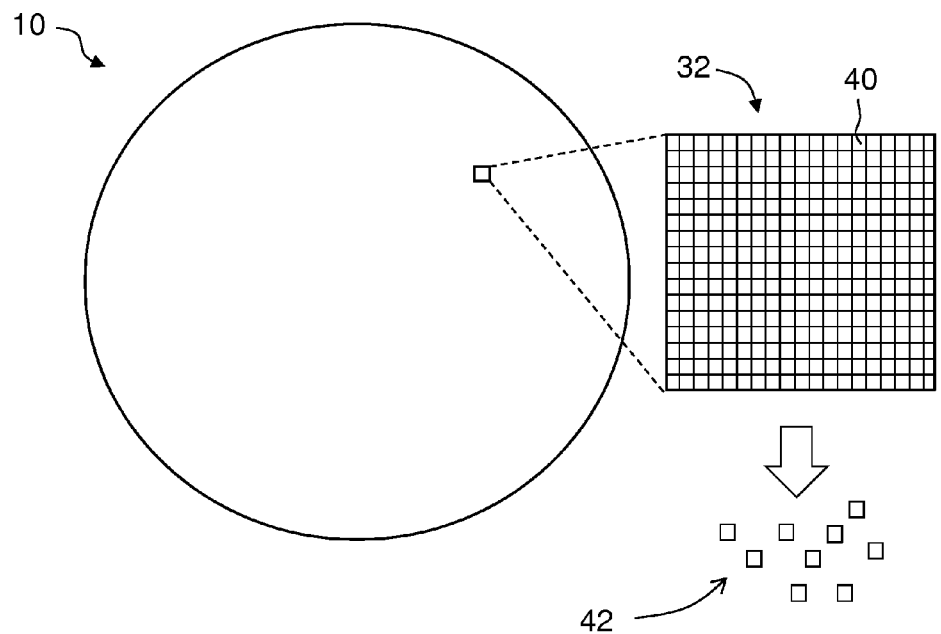
FIG. 1 is a plan view and FIG. 2 is a cross-sectional view of an example product wafer used in the formation of semiconductor light-emitting devices.

Cartesian coordinates are shown in some of the Figures for the sake of reference and are not intended as being limiting as to orientation or configuration.

DETAILED DESCRIPTION

Reference is now made in detail to the present preferred embodiments of the disclosure, examples of which are illustrated in the accompanying drawings. Whenever possible, the same reference numbers and symbols are used throughout the drawings to refer to the same or like parts. The claims are incorporated into and constitute part of this detailed description.

In the discussion below, the device-layer stress is the stress in the device layer 30 that defines the devices 50 formed therein and is represented by S(x,y) or just S, which is shorthand notation for S(x,y;σi,j), where $\sigma_{i,j}$ is the stress tensor. The stress tensor $\sigma_{i,j}$ defines the stress at any point in the device layer of the substrate. The coordinates (x,y) represents the Cartesian wafer coordinates of the point in the device layer 30 where the stress is defined. The stress tensor $\sigma_{i,j}$ defines three orthogonal normal stress components ($\sigma_{11}$, $\sigma_{22}$, $\sigma_{33}$) and six orthogonal shear stresses ($\sigma_{12}$, $\sigma_{13}$, $\sigma_{21}$, $\sigma_{23}$, $\sigma_{31}$, $\sigma_{32}$). When the coordinate system used to measure stress is oriented in the principle directions, the stress tensor comprises only the three orthogonal normal stress components. In an example, S(x,y) has a single value that represents the stress, and this single value can be, for example, the largest stress component, the sum of the stress components, the average of the stress components, or some combination of the stress components. In another example where the rate of change of the stress at a given (x,y) location is employed, the notation S'(x,y) is used.

Also in the discussion below, the curvature C(x,y) of a surface is shorthand for C(x,y;n), wherein n is the normal vector in a given direction in the X-Y plane and that defines a plane that intersects the surface at right-angles to the X-Y plane, and C(x,y) is the curvature of the curve that the surface makes when it intersects the plane. The curvature generally is defined as 1/R, where R is a local radius of the curvature of the surface at the point (x,y) in the plane defined by normal vector n. In an example, n is taken along a single direction, in which case C(x,y) is a scalar function. Generally, C(x,y) is a tensor because it can have multiple curvatures associated with it, namely one for each direction for unit vector n. In an example, the curvature C(x,y) can be determined from the function H(x,y) that defines the height of each (x,y) surface point as measured to some reference plane (e.g., a perfectly flat wafer). In particular, C(x,y) can be obtained from H(x,y) by fitting a circular curve to the points surrounding the point (x,y) in a given plane to obtain a best-fit radius R, and then determining the curvature as 1/R. C(x,y) can also be obtained from the second derivative of H(x,y) using standard mathematical techniques. The notation $C_0$ is used to denote the curvature of the substrate used to form the product wafer.

In the discussion herein, the acronym "LED" is generally understood to mean "light-emitting device," but it can also mean "light-emitting diode," and one skilled in the art will understand the difference based on the context in which this acronym is used.

Figure 2:
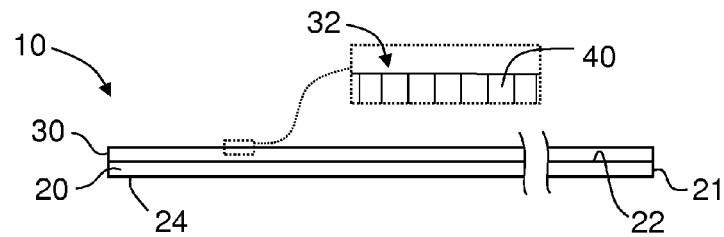

FIG. 1 is a plan view and FIG. 2 is a cross-sectional view of an example product wafer 10 used to form semiconductor LEDs, such as light-emitting diodes, and laser diodes. Here, the term "product wafer" generally means a wafer or a substrate on which device structures are formed, and wherein the device structures are then used to make light-emitting devices that, in an example, can be used to form an LED product or device.

A product wafer 10 comprises a semiconductor substrate 20 having an edge 21, a top surface 22 and a bottom surface 24, with a device layer 30 formed on the surface 22. An example semiconductor substrate 20 is made of sapphire or silicon. A device layer 30 comprises an array 32 of semiconductor light-emitting device structures ("device structures") 40. In an example, a product wafer 10 includes many thousands of device structures 40, which may have a size of about 1 mm. An example product wafer 10 has a diameter of 2 to 6 inches for a sapphire substrate 20, and a diameter of 6 to 12 inches for a silicon substrate. The device structures 40 have associated therewith an actual emission wavelength $\lambda_E$ and an output spectrum $\Delta\lambda$ that is associated with the aforementioned color temperature. The desired or select emission wavelength for device structures 40 is denoted as $\lambda_{ED}$.

Figure 3:
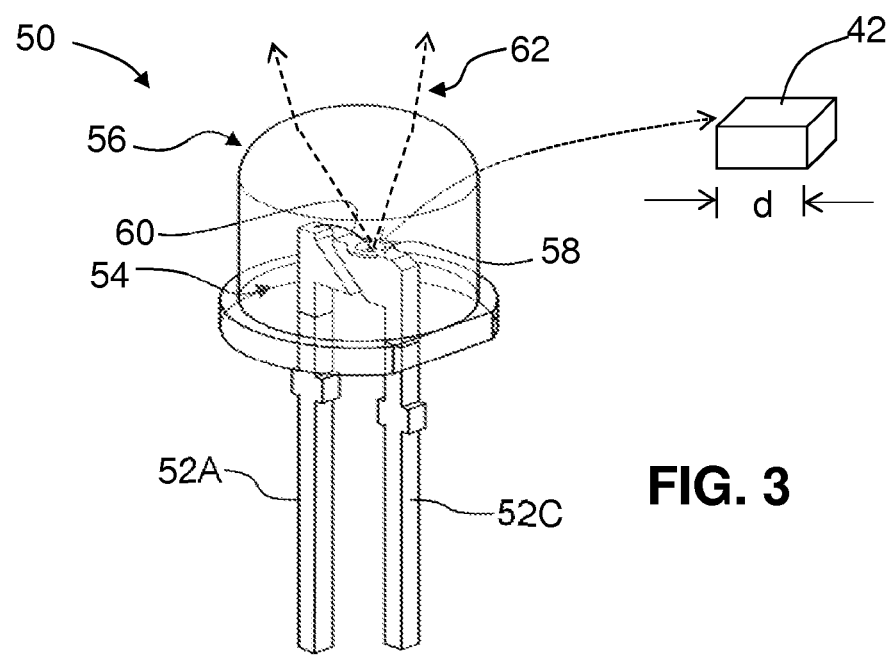
FIG. 3 is a perspective view of an example LED device showing how the die from the product wafer is incorporated into the LED device structure.

Once a product wafer 10 is completely processed so that the device structures 40 are functional, the product wafer 10 is cut ("diced") so that the individual device structures in the array 32 are separated to form individual dies 42. The dies 42 are then incorporated into a semiconductor light-emitting device structure to form a light-emitting device 50, such as illustrated in FIG. 3 as a perspective view of an example LED device. The LED device 50 of FIG. 3 includes an anode 52A and a cathode 52C that extend into an interior 54 of an epoxy lens casing 56. The cathode 52C includes a reflective cavity 58 in which the die 42 resides. Wire bonds 60 electrically connect the anode 52A and the cathode 52C to the LED. A power source (not shown) connects to the anode 52A and the cathode 52C to provide the electricity needed to power the LED so that it emits light 62 at the actual wavelength $\lambda_E$. The LED device 50 of FIG. 3 is a prior art device when the die 42 is a prior art die, but is not a prior art device when the die 42 is formed using the methods disclosed herein.

Example device structures 40 are the form of LEDs that are fabricated by growing GaN on a sapphire substrate 20. The GaN is grown using a metalorganic chemical vapor deposition (MOCVD) process. The MOCVD process is carried out in a MOCVD reactor and is performed in a manner that results in the formation of multi-quantum-well structures (not shown).

Figure 4:
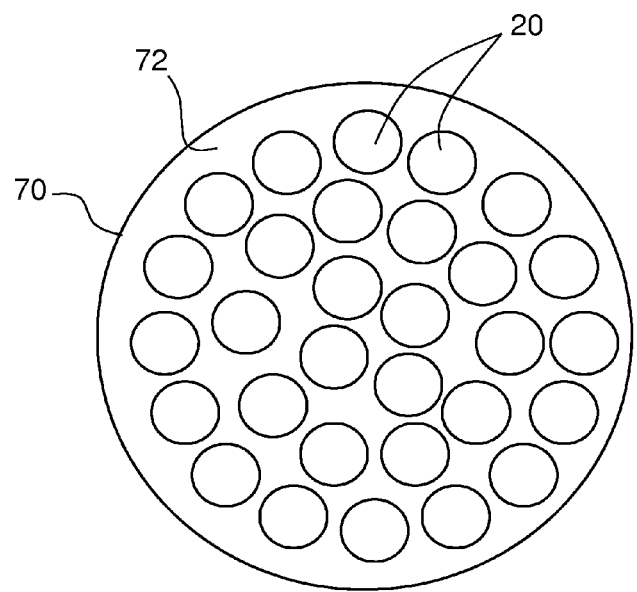
FIG. 4 shows a collection of sapphire substrates supported in a susceptor.
Figure 5:
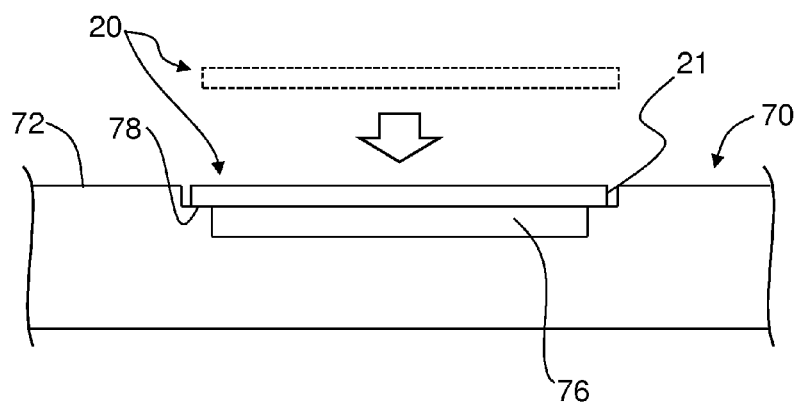
FIG. 5 is a close-up cross-sectional view of a portion of the susceptor showing how the substrate is supported therein.

FIG. 4 shows a collection of sapphire substrates 20 supported in a substrate holder or a susceptor 70 having a top surface 72. FIG. 5 is a close-up, cross-sectional view of the susceptor 70 illustrating an example of how substrates 20 are supported therein. The susceptor 70 includes openings 76 formed in the top surface 72, where the opening defines a lip 78 that supports the substrate 20 on its bottom surface 24 near its edge 21.

Figure 6:
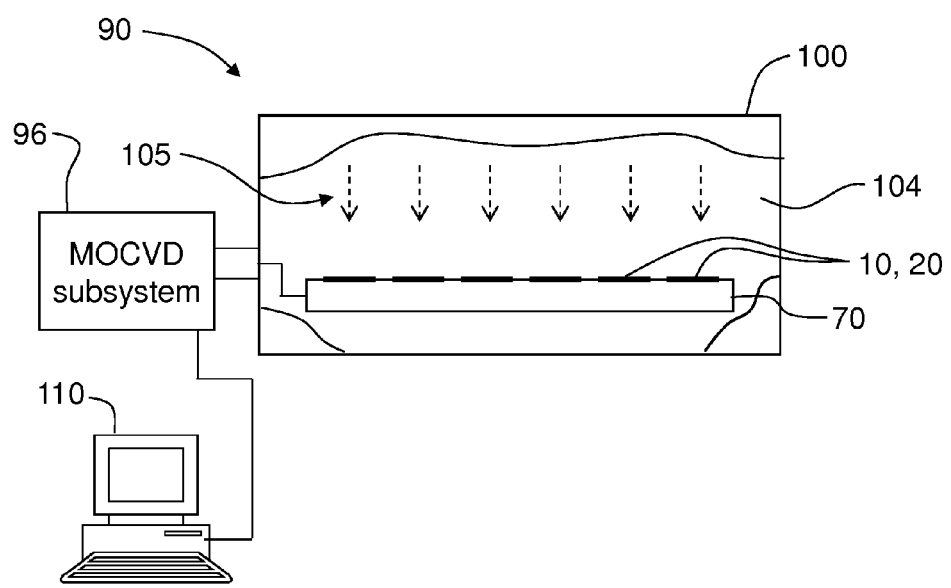
FIG. 6 is a schematic diagram of an MOCVD reactor system used to form the device layer atop the substrate to form the product wafer of FIG. 2.

FIG. 6 shows a MOCVD reactor system 90 having reactor chamber 100 operably connected to a MOCVD subsystem 96. The MOCVD subsystem 96 includes the various MOCVD system components (not shown), such as a vacuum pump, gas sources, a venting system, a baratron, etc. The MOCVD chamber 100 has interior 104 in which a susceptor 70 and substrates 20 reside when the MOCVD process is performed. Note that after the MOCVD process is performed, the substrates 20 become product wafers 10. The MOCVD reactor system 90 includes a controller 110 operably coupled to the MOCVD subsystem 96. The controller 110 is configured to control the MOCVD process (as indicated by arrows 105) that occurs in the reactor interior 104.

In particular, the controller 110 is used to carefully control the temperature T of product wafers 10 because the actual emission wavelength $\lambda_E$ varies considerably as a function of the MOCVD growth conditions. FIGS. 7A through 7D are plan views of an example product wafer 10, schematically illustrating example contours of temperature T(x, y), device dimension D(x,y), device-layer stress S(x,y) and the (actual) emission wavelength $\lambda_E$(x,y), respectively. Here, the temperature T refers to either the substrate temperature or the product wafer temperature, since the substrate 20 is undergoing processing to form the product wafer 10. The discussion below refers to "product wafer temperature" for ease of discussion.

As the product wafer temperature T(x,y) changes (FIG. 7A), the device dimensions D(x,y), e.g., the thickness of the multi-quantum well structures (not shown) formed during the MOCVD process, change in a corresponding manner (FIG. 7B). This also translates into a corresponding change in device-layer stress S(x,y) over the product wafer 10 (FIG. 7C), which in turn results in a corresponding change the actual emission wavelength $\lambda_E$ (x,y) (FIG. 7D).

In certain cases, a 1° K temperature change in the product wafer temperature T can lead to an approximate shift $\delta\lambda_E$ of 1 nm in the emission wavelength $\lambda_E$. Hence, it becomes desirable to first detect, and eventually control, the temperature non-uniformities and temperature repeatability in the MOCVD reactor system 90 to ensure proper control of the product wafer temperature T. Temperature non-uniformities on a product wafer can lead to local changes in growth conditions, which can result in variations in the LED emission wavelength.

In present-day, MOCVD-based manufacturing of device structures 40, the actual emission wavelength $\lambda_E$ and the corresponding emission uniformity is unknown until the device structure 40 is diced from the product wafer 10 to form die 42, and then the die incorporated into a light-emitting device such as an LED device 50 of FIG. 3 or an equivalent test structure.

Currently, to estimate or predict the LED emission wavelength $\lambda_E$, substrates are inspected with a photoluminescent technique, where a short wavelength source (typically 248 nm) is made incident upon the multi-quantum well region to excite emission. However, a significant limitation of this technique is that it is a point-by-point inspection technique. To accurately map an entire product wafer with high spatial resolution (e.g., a spatial resolution smaller than a die size) takes from 30 minutes to 240 minutes, depending on the substrate size used to form the product wafer.

A further limitation of this technique is that the emission wavelength from photoluminescence is generally not the same emission wavelength from the LED during electrical stimulation. The source of this difference is believed to be from the additional manufacturing steps that the LED undergoes between the photoluminescence inspection and the final product. Typically, there is an offset between the photoluminescence emission wavelength and the electrically stimulated LED emission wavelength that is pre-measured in production. This is then used as a process monitor.

The amount of device-layer stress S(x,y) in the device structures 40 formed on the product wafer 10 is directly related to the history of the product wafer temperature T(x,y), i.e., T(x,y,t), where t is time. Fundamentally, differences in the product wafer temperature (i.e., non-uniform heating) during the deposition process leads to thickness variations in the deposited GaN layers and in particular, the multi-quantum well layers. After the deposition, and when the substrate is returned to room temperature, the differences in the coefficients of thermal expansion of the constituent materials making up the device structures 40 lead to the relative expansion or contraction of the device structures 40 relative to the substrate 20 during thermal cycles. The non-uniform heating leads to non-uniform device-layer stress and non-uniform emission wavelength ($\lambda_E$).

This relative expansion or contraction give rise to stresses in device structures 40 formed on product wafer 10, such that the thermal energy imparted to the product wafer is partially stored as mechanical energy in device layer 30. Non-uniformities (i.e., variations) in the product wafer temperature T(x, y) during deposition lead to non-uniformities (variations) in the layer thicknesses and eventually, in the device-layer stress S(x,y). Product wafers 10 with uniform but different temperatures T(x,y) will have a uniform but different device-layer stress S(x,y).

The device-layer stress S(x,y) can be monitored through changes in the substrate curvature $\Delta C(x,y)$. Most common stress metrology systems rely on measurements of the change in product wafer shape to calculate the device-layer stress. The devices stress S(x,y) in device structures 40 supported by the product wafer 10 is calculated from the curvature change $\Delta C(x,y)$ using the Stoney formula:

$$S(x,y) = \{M_S h_S^2 / 6 h_F\} \Delta C(x,y) \qquad \text{EQ. 1}$$

where M is the biaxial modulus, h is the thickness, and the subscript "F" stand for the deposited film (GaN in this example) and the subscript "s" is for the substrate (sapphire or silicon in this example). Variations in C(x,y) across the wafer indicate a non-uniform device-layer stress S.

Knowing that the device-layer stress S can arise due to temperature and coefficient of thermal expansion (a) mismatch between the film (i.e., device layer 30) and the underlying substrate 20, one can derive the following expressions for the device-layer stress S and the curvature C:

$$S(x,y)=M_f\epsilon_m(T)=M_f(\alpha_f-\alpha_s)\Delta T \quad \text{EQ. 2}$$

$$C(x,y)=\{6M_fh_f/M_sh_s^2\}(\alpha_f-\alpha_s)\Delta T \quad \text{EQ. 3}$$

where $\epsilon_m$ is the mismatch or misfit strain between the film and substrate, $\Delta T$ is the temperature difference from the stress-free temperature $T_o$ (i.e., the temperature at which the film and substrate are matched).

The above equations show how the curvature variations $\Delta C(x,y)$ are related to the changes in the deposited temperature. Hence, from these expressions, one can relate the product wafer curvature to the temperature, which is directly related to the emission wavelength $\lambda_E$ of the LED.

The equations provided above are based on specific assumptions regarding the stress and deformation state, the geometry of the device structure and the thermo-mechanical properties of the constituent materials. More complex forms or versions of these equations can be developed for film/substrate systems having arbitrary attributes. Nevertheless, for any specific device/substrate system, the appropriate relations may be developed along the lines set forth herein to relate substrate curvature variations to temperature variations to emission wavelength variations.

An aspect of the disclosure correlates at least one product wafer characteristics, such as product wafer stress (i.e., one or more components of the stress tensor) and curvature, to at least one LED performance characteristic, such as emission power, efficiency, wavelength, spectral bandwidth, and the like. In an example, this is accomplished by empirically establishing a relationship between the at least one measured performance characteristic of the LED to the at least one product wafer characteristic. This can be accomplished in one example by evaluating at least one performance characteristic of the LEDs obtained from the product wafer against the individual process steps used to form the product wafer. This can also be accomplished by evaluating the at least one LED performance characteristic against multiple process steps used to form the product wafer.

Thus, an aspect of the disclosure includes a method of employing at least one of product wafer stress and product wafer curvature as a process monitor to perform quality control that bins or culls the performance of the individual die of the product wafer. The method can also include monitoring deposition characteristics during product wafer formation, and performing process optimization. The method can further include matching the performance of a set of two or more of the same type of process tools so that the product wafers and thus their LED die are also matched when formed on the different process tools. That is to say, the product wafers formed by the different process tools in the matched set are more alike than if the process tools were not matched.

Figure 8A:
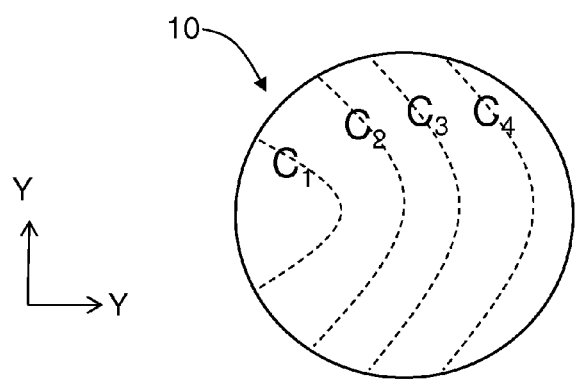
FIGS. 8A through 8C are plan views of a product wafer illustrating contours that show variations in the product wafer curvature C, device-layer stress S and emission wavelength $\lambda_E$, respectively.
Figure 8B:
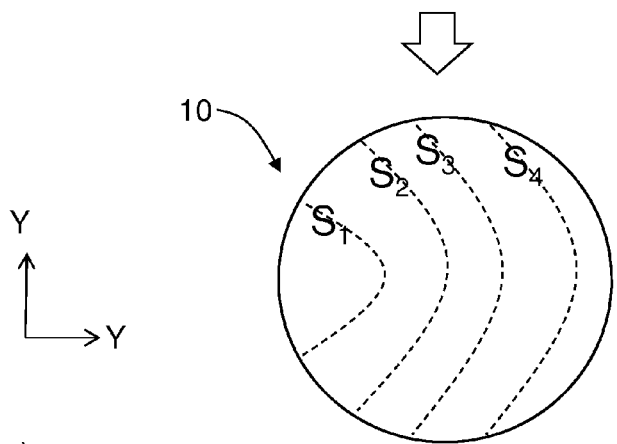
Figure 8C:
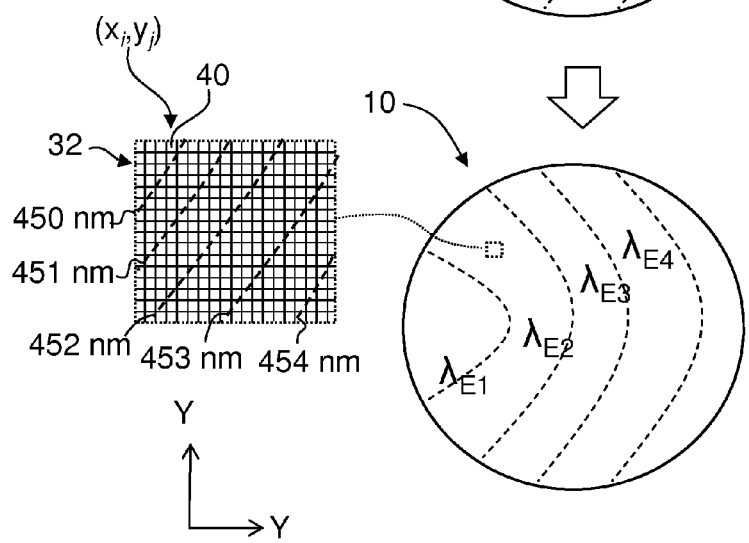

FIGS. 8A through 8C are plan views of an example product wafer 10 schematically illustrating example contours of curvature C(x, y), device-layer stress S(x,y) and actual emission wavelength $\lambda_E(x,y)$. An aspect of the disclosure involves determining the device-layer stress S(x,y) by measuring the product wafer curvature C(x,y), and then using the determined device-layer stress S(x,y) to predict the actual emission wavelength $\lambda_E$ of the resulting (separated) dies 42 as a function of position (x,y) of the corresponding device structures 40 of the product wafer 10.

In FIG. 8C, one particular device structure 40 is shown having a position $(x_i,y_j)$, which is measured relative to a reference location, e.g., the center of the product wafer. The close-up inset of array 32 of device structures 40 shows more detailed (i.e., closely-spaced) contours $\lambda_E$ of the actual emission wavelength $\lambda_E$ in 1 nm increments. In an example, variations (shifts) in the emission wavelength of $\delta\lambda_E$ of 1 nm can be predicted.

Figure 8D:
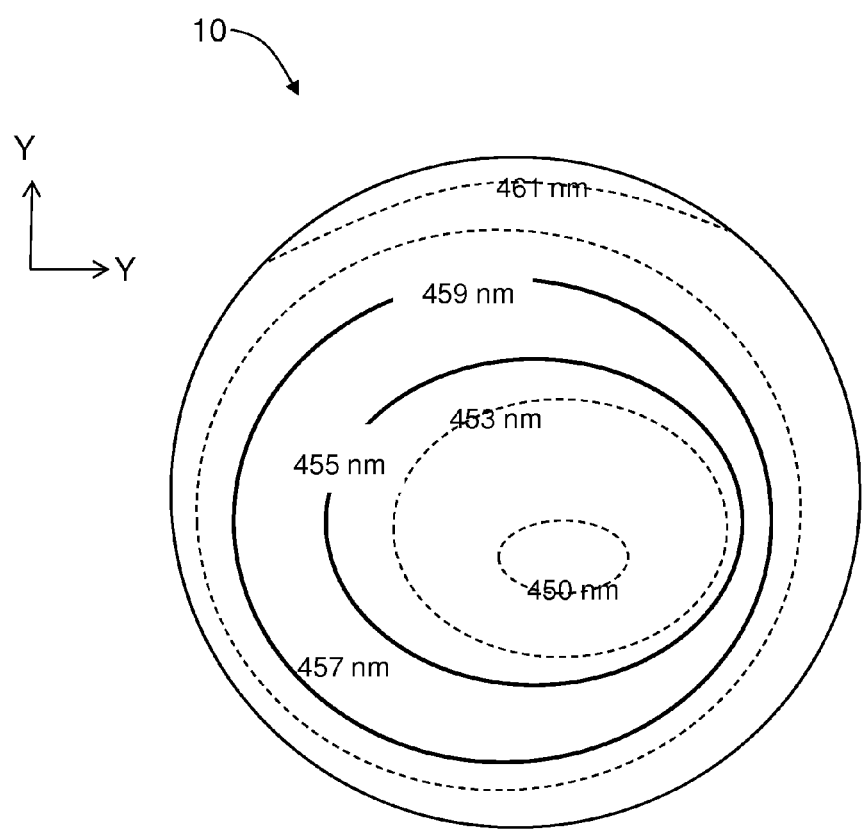
FIG. 8D is a plan view of a product wafer similar to that of FIG. 8C and illustrating an example where predicted emission wavelengths are shown, and wherein the contours of 457 nm and 455 nm are in bold because they represent the boundaries within device structures having a desired wavelength of 456 nm+/−1 nm reside.

FIG. 8D is a plan view of a hypothetical product wafer 10, showing example 2 nm contours of predicted emission wavelength $\lambda_{EP}$ wherein the product wafer 10 has a concave or bowl-shaped curvature C(x,y). Assuming a desired emission wavelength of $\lambda_{ED}$=456 nm with an emission wavelength variation tolerance $\delta\lambda$ of +/−1 nm, the predicted-wavelength contours of FIG. 8D allow one to dice the product wafer 10 and use in the final light-emitting device 50 only those dies 42 from device structures 40 having (x,y) positions within the 455 nm and 457 nm predicted-wavelength contours, which are shown as solid lines (i.e., within the emission-wavelength variation tolerance $\delta\lambda$). Thus, in an example, a first number of LED structures 40 fall within the 455 nm and 457 nm contours and a second number of LED structures 40 fall outside of these contours. This type of culling of LED structures 40 based on a select specification (here, emission wavelength) can be used to disposition the resulting LED dies 42 for first and second applications or first and second types of LED devices.

At this point, the number of dies 42 within the acceptance wavelength variation (i.e., $\delta\lambda$=+/−1 nm in this example) can be estimated. In addition, the number of dies 42 that are slightly outside this window, but still useful for "off-color" applications can be estimated. Further, the number of dies 42 that are outside any useful range, and hence, have no intrinsic value can also be estimated. From the number of dies 42 within each wavelength variation range, and knowing the value of the dies 42 for each wavelength variation range, the intrinsic value of the product wafer 10 can be determined. This allows an LED manufacturer to determine if there is sufficient reason to continue processing a particular product wafer 10. For example, if the array of die falls outside the range of wavelengths with any value, there is little reason to continue processing the wafer 10 and incurring additional expenses.

To summarize, changes in the deposition temperature during LED formation result in wavelength shifts in the emission wavelength $\lambda_E$ of the LED. These same temperature changes lead to changes in stress in the deposited films, which result in changes in wafer curvature. Hence, the changes in wafer curvature C can be related to wavelength shifts through the above equations.

In practice, it may be difficult to know the exact values for the material constants (such as the coefficient of thermal expansion a and the biaxial modulus M) for a variety of materials at the elevated temperatures that are used during the MOCVD process. For example, typical temperatures in the MOCVD process are often around 1000° C. To analytically tie the equations above to the actual LED wavelength shift requires precise knowledge of these material constants and the temperature history of the substrate 20. This information may not be available.

It therefore may be more convenient to empirically obtain the necessary data and develop a lookup-table or correlation curve for the actual wavelength shifts by making precise measurements of curvature C for all points on one or more test product wafers 10 and measuring the LED emission wavelengths $\lambda_E$ of the LED dies 42 obtained from the product wafer 10. This approach allows one to correlate the measured substrate curvatures C to actual device data, and use substrate curvature as a process control and inspection monitor for subsequent high-volume LED manufacturing.

The primary advantage of using wafer curvature C to monitor the emission wavelength $\lambda_E$ and emission uniformity over the presently used photoluminescence technique is that the wafer curvature can be measured at very high spatial frequency in a very short time. A coherent-gradient sensing system (described below) can easily sample a substrate with a spatial sampling of a few hundred microns, which is below the typical die size of 1 mm, and can inspect (measure) a 200-mm wafer in approximately 1 minute. In comparison, to achieve similar spatial information on a 200-mm wafer using a photoluminescence system would take several hours.

Figure 9:
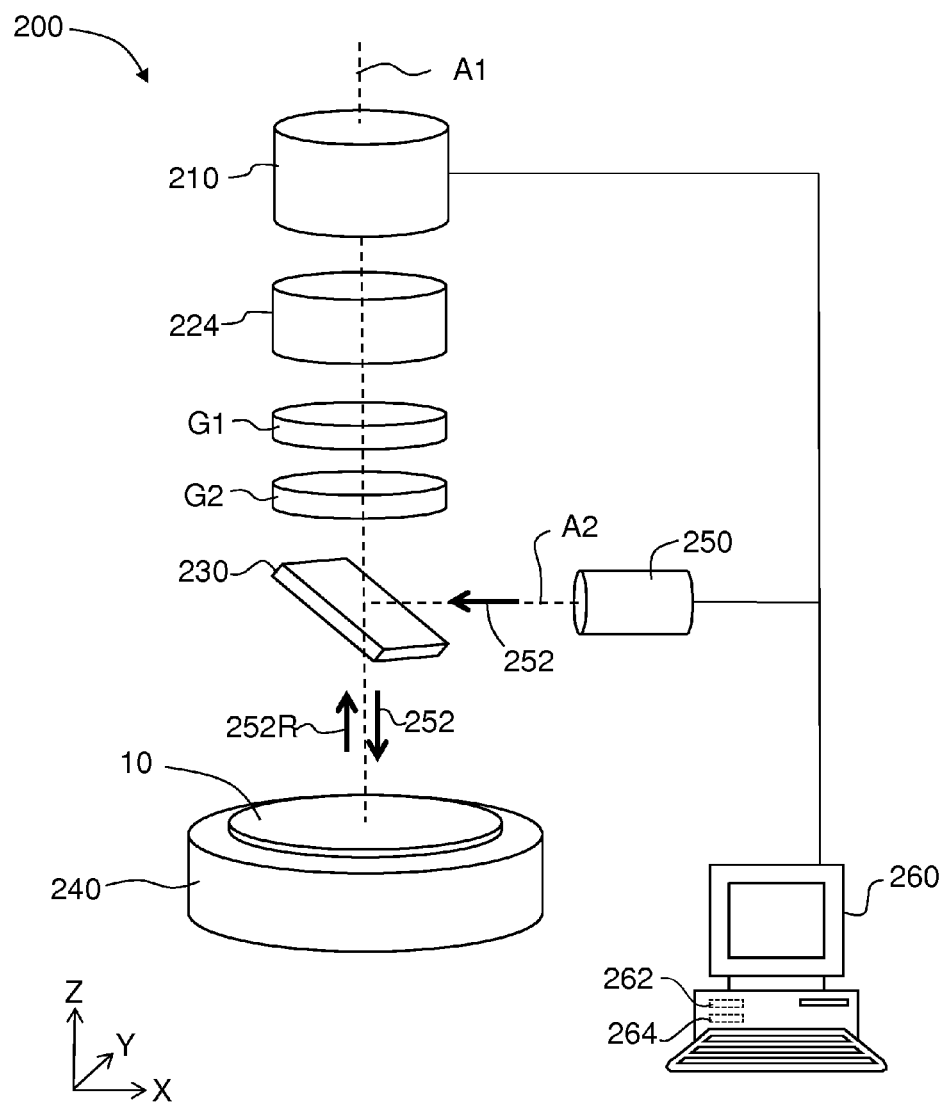
FIG. 9 is a schematic diagram of an example coherent gradient sensing (CGS) system that is used in an example to measure substrate and product wafer curvatures.

FIG. 9 is a schematic diagram of an example coherent-gradient sensing (CGS) system 200 that can be used to measure the curvature C(x,y) of a product wafer 10. The details about how CGS sensing works are described in U.S. Pat. No. 6,031,611 (the '611 patent), which patent is incorporated by reference herein. FIG. 9 is based on FIG. 1 of the '611 patent.

The CGS system 200 includes, along an axis A1, a digital camera 210, a filtering lens 224 (e.g., a filter in combination with a lens, as discussed in the '611 patent and shown in FIG. 1 therein), first and second axially spaced-apart gratings G1 and G2, a beamsplitter 230, and a wafer stage 240. The CGS system 200 also includes a laser 250 arranged along an optical axis A2 that intersects axis A1 at beamsplitter 230. The CGS system 200 also includes a controller or signal processor 260 operably connected to the digital camera 210 and to the laser 250. An example signal processor 260 is or includes a computer having a processor 262 and a computer-readable medium ("memory") 264, which are configured via instructions recorded thereon to control the operation of the CGS system 200 to perform a measurement of the product wafer curvature C(x,y) according to the methods described in the '611 patent.

In operation, the laser 250 generates a collimated laser beam 252 that is directed to the product wafer 10 by the beamsplitter 230. The collimated laser beam reflects from product wafer 10 (an in particular from device layer 30) as reflected light 252R, which travels upwards through the beamsplitter 230 and through gratings G1 and G2. The two gratings G1 and G2 are spaced apart and otherwise configured to shear the collimated laser beam. The light passing through gratings G1 and G2 is then focused onto the digital camera 210 using the filtering lens 224.

The shearing and filtering processes produce fringes at digital camera 210 that are contours of constant surface slope on the product wafer 10. Consequently, two orthogonal sets of interferograms are used to characterize the surface slopes that can be integrated numerically to reconstruct the substrate topography, or differentiated numerically to obtain product wafer curvature C(x,y). A two-camera configuration for CGS system such as shown in FIG. 6 of the '611 patent can also be employed to facilitate capturing the two orthogonal sets of interferograms.

A curvature map, i.e., the product wafer curvature C(x,y), is then generated from the interference fringe pattern using, for example, the methods described in the '611 patent as carried out in the controller 260. In an example, the measured curvature C(x,y) of the product wafer 10 has a spatial resolution on the order of 100 microns to 300 microns. Thus, for device structures 40 having a dimension d on the order of 1 mm (see FIG. 3), there can be at least one curvature data point per device, and in some cases multiple data points per device (die). In an example, the methods disclosed herein include determining a spatial variation in the stress S(x,y) in the product wafer to a dimension that is substantially equal to or less than the dimension d of device structures 40.

In an example, the curvature $C_0(x,y)$ of substrate 20 is measured prior to processing the substrate to form the product wafer 10. This allows for the change in curvature $\Delta C(x,y) = C(x,y) - C_0(x,y)$ to be calculated.

Once the substrate and product wafer curvatures $C_0(x,y)$ and $C(x,y)$ are measured and the change in curvature $\Delta C(x,y)$ is calculated, the device-layer stress S(x,y) can be determined. In an example, this is accomplished using the Stoney equation (EQ. 1, above) that relates device-layer stress S to the change in curvature $\Delta C$.

For most product wafers 10, the change in curvature $\Delta C(x,y)$ varies across the wafer and also varies with orientation, implying the presence of a non-uniform device-layer stress S(x,y). Alternatively, if the material properties at the respective temperatures are not known, one can measure the wavelength shift $\delta\lambda$ vs. measured curvature C on sample substrates (wafers) and tie these measurements together for future measurements for the product wafers 10.

Other methods can be used to make measurements that allow for determining C(x,y). Such methods include for example profilometry, interferometry, capacitance gauges, and laser beam deflection. Likewise, the device-layer stress S(x,y) can be determined by measurements of the distortion of the crystal lattice by using, for example, X-ray diffraction and Raman spectroscopy.

Thus, one aspect of the method of the disclosure includes the following.

1. Measure the shape (curvature) $C_0(x,y)$ of a substrate 20 before processing, e.g., prior to carrying out MOCVD.
2. Measure the shape C(x,y) of a product wafer 10 after processing.
3. Calculating $\Delta C(x,y) = C(x,y) - C_0(x,y)$ to determine the change in curvature $\Delta C$ associated with the product wafer 10 that was induced by processing the substrate 20 to create the product wafer.
4. Compute the device-layer stress S(x,y) in the product wafer using the Stoney formula or a related formula (e.g., Blake's Equation) to calculate the process-induced device-layer stress S(x,y) in the product wafer based on $\Delta C(x,y)$.
5. Associate device structures 40 located at positions $(x_i, y_j)$ with a device-layer stress $S(x_i, y_j)$.
6. Associated device-layer stress values $S(x_i, y_j)$ with emission wavelengths $\lambda_E(x_i, y_j)$, which then allows for a measurement of product wafer curvature to predict emission wavelengths of the LED structures 40 that form the LED die when the product wafer is diced.

Step 6 above requires establishing a relationship between the actual emission wavelength $\lambda_E$, the change in curvature $\Delta C$ and the change in device-layer stress S(x,y) for the given type of process and device structures 40 being produced. This can be done if all the material properties are well known and if the relationship between temperature and deposition rate is well known. As discussed above, these quantities may not be well known and it becomes necessary to empirically generate data to correlate the measured curvature variations to the emission wavelength variations.

In an example, this empirical "fingerprinting" process can be carried out as follows:

1. Complete Steps 1 through 4 for one or more test product wafers 10 for a particular process for forming device structures 40;
2. Measure the actual emission wavelength $\lambda_E$ of the LED dies obtained from the test product wafers 10 as a function of device structure locations (x, y) to establish $\lambda_E$(x, y); and
3. Determine the relationship between the device-layer stress S(x, y) and actual emission wavelength $\lambda_E$(x, y).

Methods of the present disclosure also include performing process monitoring and process control of product wafers 10 to determine (predict) the actual emission wavelengths $\lambda_E$ that the LED dies 42 will produce when the product wafer 10 is diced. This can be done for a given product wafer and between different product wafers for the same process (i.e., same device structures). Select LED dies 42 characterized using the methods disclosed herein can then be used in select types of LED devices 50 such as shown in FIG. 3.

Methods of the present disclosure also include performing process optimization for forming the device structures 40 by adjusting at least one of the process variables used in forming product wafers 10. This includes for example:
1. Establishing a relationship between process variables (e.g. temperature, temperature uniformity, gas partial pressure, gas partial pressure uniformity, flow rate, flow rate uniformity, time) and process-induced stress characteristics (e.g. average stress and stress uniformity); and
2. Modifying at least one of the process variables to optimize the stress characteristics of the process that results in the desired device characteristics, such as the emission wavelength being as close as possible to a desired emission wavelength Methods of the present disclosure directed to process optimization also include the following:
1. Establishing the stress characteristics associated with different processing tools used to carry out the same process, e.g., different MOCVD reactor systems.
2. Identifying specific processing tools that result in the least desirable stress characteristics, i.e., stress characteristics that lead to the greatest amount of device performance variations (e.g., greatest variation in actual emission wavelength).
3. Identify processing tool parameters, such as hardware or control settings, adjustments, etc., that affect the stress characteristics (i.e., wafer temperature, wafer temperature uniformity, gas partial pressure, gas partial pressure uniformity, gas flow rate, gas flow rate uniformity, etc).
4. Adjusting the processing tool parameters to obtain a reduced variation in the emission wavelength $\lambda_E$, and in a specific example minimizing the variation in the emission wavelength $\lambda_E$ of the LED dies.

Figure 10:
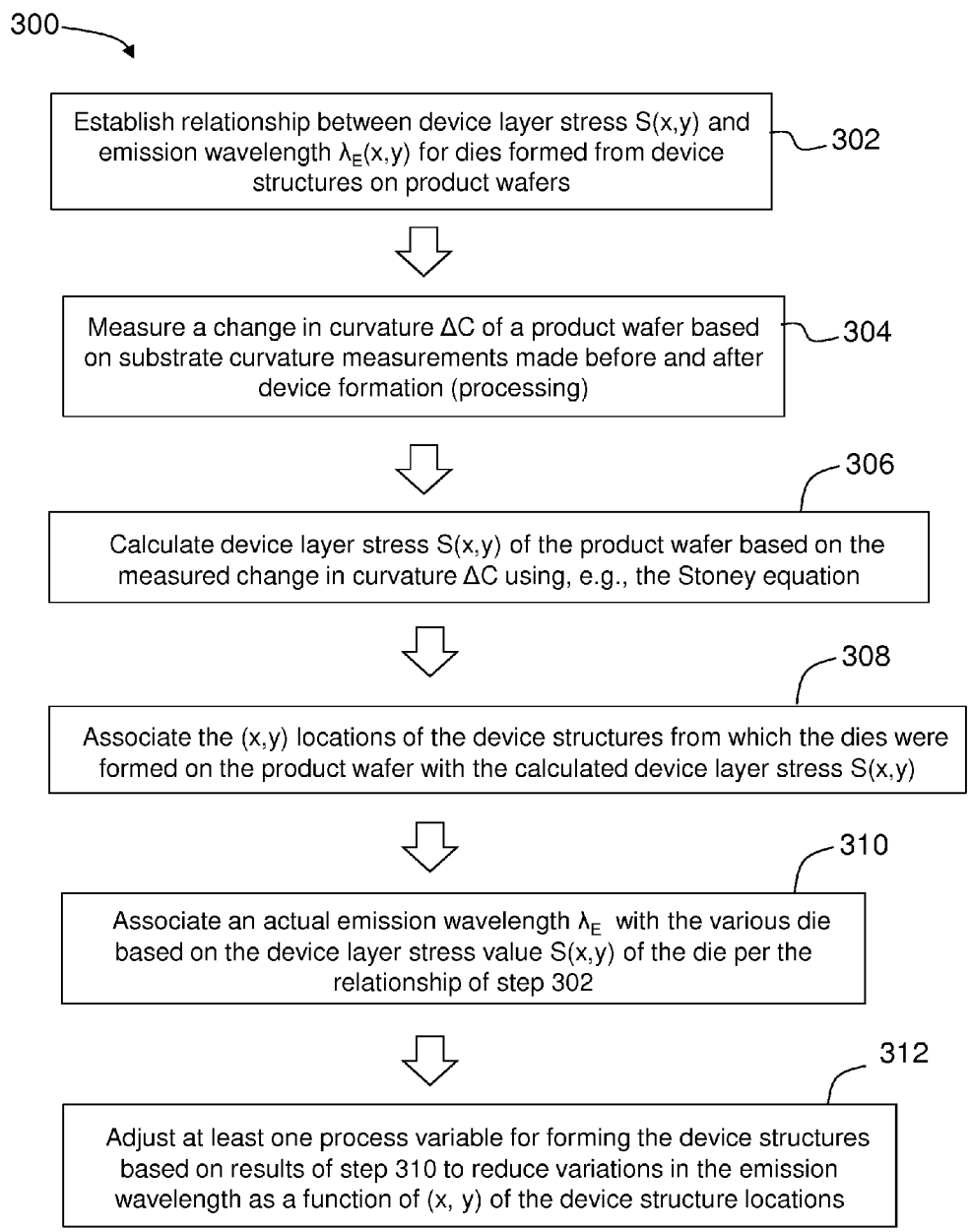
FIG. 10 is a flow diagram that sets forth an example method of predicting the emission wavelengths of dies from product wafers based on curvature measurements of the product wafer.

FIG. 10 is a flow diagram 300 that sets forth an example method of predicting the actual emission wavelengths $\lambda_E$ for LED dies 42 formed from product wafers 10 based on curvature measurements of the product wafer and the substrate used to form the product wafer.

Flow diagram 300 includes a first step 302 of establishing a relationship between device-layer stress S(x,y) and actual emission wavelength $\lambda_E$(x,y) for dies 42 formed from device structures 40 on product wafers 10.

Flow diagram 300 includes a second step 304 that includes measuring the change in curvature $\Delta C$(x,y) of product wafer 10 based on substrate curvature measurements $C_0$(x, y), as described above.

Flow diagram 300 includes a third step 306 of calculating the device-layer stress S(x,y) of the product wafer 10 based on a measured changed in curvature $\Delta C$ using, e.g., the Stoney equation.

Flow diagram 300 includes a fourth step 308 of associating the (x,y) device structures 40 from which the dies 42 were formed on the product wafer 10 with the calculated device-layer stress S(x,y).

Flow diagram 300 includes a fifth step 310 of associating an actual emission wavelength $\lambda_E$ with the various dies 42 based on the device-layer stress values S(x,y) established in step 302.

Flow diagram 300 includes a sixth step 312 of adjusting at least one process variable to reduce the variation in the emission wavelength $\lambda_E$ of the dies 42.

In another example of the methods disclosed herein, product wafer curvature measurements can be made at different stages (steps) of completion of the product wafer processing. This can provide insight as to how the product wafer curvature changes for each process step.

Also, as discussed above, flow diagram 300 can include as part of step 302 the sub-step of empirically obtaining the necessary data from test product wafers 10 to develop a lookup-table or correlation curve for the actual wavelength shifts by making precise measurements of curvature C on a sample (set) of wafers and measuring their LED emission wavelengths $\lambda_E$ afterwards to correlate the measured substrate curvatures C to actual device data. This allows for the use of product wafer curvature measurement as a process control and inspection monitor for subsequent high-volume LED device manufacturing.

It will be apparent to those skilled in the art that various modifications and variations can be made to the present disclosure without departing from the spirit and scope of the disclosure. Thus it is intended that the present disclosure cover the modifications and variations of this disclosure provided they fall within the scope of the appended claims and their equivalents.

What is claimed is:

1. A method of characterizing the emission wavelength of a semiconductor light-emitting device structure of a product wafer having a substrate, comprising:
   establishing a relationship between a device-layer stress S(x,y) and the emission wavelength $\lambda_E$(x,y) for the device structures formed on the product wafer by measuring the device-layer stress S(x,y) of a test product wafer, dicing the test product wafer to form dies, and measuring the emission wavelengths of the dies as a function of their device-layer stress and corresponding device structure locations (x,y);
   measuring a change in curvature $\Delta C$(x,y) of the test product wafer based on curvature measurements of the substrate performed before and after substrate processing to form the device structures;
   calculating the device-layer stress S(x,y) in the test product wafer based on the measured changed in curvature $\Delta C$; and
   associating the actual emission wavelength $\lambda_E$ with the device structures based on the relationship between the device-layer stress S(x,y) and the (x,y) positions on the test product wafer to establish a predicted emission wavelength for the device structures that corresponds to the emission wavelength $\lambda_E$.

2. The method of claim 1, further calculating the stress S(x,y) in the test product wafer based on the measured changed in curvature $\Delta C$ via the relationship $$S(x,y) = \{M_S h_S^2 / 6 h_F\} \Delta C(x,y)$$

where $M_s$ is a biaxial modulus of the substrate, $h_S$ is a height of the substrate, $h_F$ is a thickness the device structures.

3. The method of claim 1, wherein the device structures have either a light-emitting diode or laser diode configuration.

4. The method of claim 1, further comprising:
establishing a desired emission wavelength;
dicing the product wafer to form dies from the device structures; and
culling the dies based on the predicted emission wavelength.

5. The method of claim 1, further comprising:
defining a tolerance on an amount of variation in the emission wavelength; and
comparing the predicted emission wavelengths to the tolerance and determining from the comparison a course of action that includes either scrapping the product wafer, reworking the product wafer, or using a select portion of the product wafer.

6. The method of claim 1, wherein the substrate processing includes performing a metalorganic chemical vapor deposition (MOCVD) process.

7. A method of characterizing an emission wavelength of a semiconductor light-emitting device (LED) structure of a product wafer having a substrate and a device layer, comprising:
a) measuring at least one characteristic of a test product wafer formed in substantially the same manner as the product wafer, wherein the at least one characteristic is selected from the group of characteristics comprising: device layer stress and product wafer curvature;
b) dicing the at least one test product wafer to form LED dies that have associated therewith a position on the test product wafer;
c) measuring an LED emission wavelength for each the LED dies to establish a set of LED emission wavelengths that vary with position on the product wafer;
d) determining a relationship between the at least one test product wafer characteristic, the set of LED emission wavelengths, and the positions of the LED dies; and
e) using the relationship determined in act d) to predict the LED emission wavelength of the LED structures formed on the product wafer.

8. The method of claim 7, further comprising binning the LED structures of the product wafer based on the relationship determined in act d).

9. The method of claim 7, wherein the product wafer includes a substrate and further comprising measuring a curvature of the substrate prior to forming the product wafer.

10. The method of claim 9, further comprising measuring at least one of the substrate curvature and product wafer curvature using coherent gradient sensing (CGS).

11. The method of claim 9, wherein the device structures have a dimension, and including determining the at least one test product wafer characteristic to a dimension that is substantially equal to or less than the device structure dimension.

12. A method of forming semiconductor light-emitting devices (LEDs), comprising:
forming a product wafer comprising LED structures formed on a substrate by a process having one or more process variables, with the substrate having a known initial curvature $C_0(x,y)$ prior to forming the LED structures thereon;
measuring a curvature $C(x,y)$ of the product wafer after forming the light-emitting device structures thereon, and determining a change in curvature $\Delta C(x,y) = C(x,y) - C_0(x,y)$;
calculating a stress $S(x,y)$ in the product wafer based on the measured changed in curvature $\Delta C(x,y)$;
associating an emission wavelength $\lambda_E$ of the LED structures with the calculated stress $S(x,y)$ based on a relationship between the calculated stress $S(x,y)$ and $(x,y)$ positions of the light-emitting device structures on the product wafer; and
comparing the emission wavelength $\lambda_E$ to an emission-wavelength variation tolerance and binning the LED structures into one or more bins based on the tolerance.

13. The method of claim 12, further comprising using only LED structures in one or more select bins to form LED devices.

14. The method of claim 12, further comprising adjusting at least one of the one or more process variables to reduce an amount of emission wavelength variation in the light-emitting device structures as a function of the (x,y) positions of the light-emitting device structures on the product wafer.

15. The method of claim 14, wherein the process variables are selected from the set of process variables comprising: time, temperature, temperature uniformity, partial gas pressure, partial gas pressure uniformity, gas flow rate and gas flow uniformity.

16. The method of claim 14, further comprising:
making curvature measurements of one or more test product wafers formed in the same manner as the product wafer;
dicing the one or more test product wafers to form LED dies; and
measuring emission wavelengths of the LED dies a function of their (x,y) position on the one or more test product wafers to the measured text product wafer curvature to the emission wavelengths.

17. The method of claim 16, further comprising:
forming a new product wafer;
measuring the curvature of the new product wafer; and
determining LED emission wavelengths of LED structures on the new product wafer based on the measured curvature of the new product wafer.

18. A method of forming semiconductor light-emitting devices (LEDs), comprising:
forming a product wafer comprising LED structures formed on a semiconductor substrate by a process having one or more process variables;
measuring a curvature uniformity of the product wafer after forming the LED structures thereon; and
adjusting at least one of the one or more process variables to meet at least one of a curvature uniformity requirement and a stress uniformity requirement.

19. A method of forming a semiconductor light-emitting device (LED), comprising:
forming a product wafer comprising LED structures formed on a substrate by a process having one or more process variables, with the substrate having known initial curvature $C_0(x,y)$ prior to forming the light-emitting device structures thereon;
measuring a curvature $C(x,y)$ of the product wafer after forming the light-emitting device structures thereon, and determining a curvature uniformity based on $C_0(x,y)$ and $C(x,y)$;
determining a first number of die that fall within a first range of curvature uniformity;
determining a second number of die that fall within a second range of curvature uniformity; and
assigning a quality value for the product wafer based on the first and second numbers.

20. The method of claim 19, further comprising dispositioning the product wafer based on the assigned quality value.

21. The method of claim 19, further comprising:
dicing the product wafer to form LED dies associated with the first and second numbers; and
using the LED dies associated with the first number for a first application and using the LED dies associated with the second number for a second application.

22. A method of forming semiconductor light-emitting devices, comprising:
forming a product wafer comprising light-emitting device structures formed on a substrate by a process having one or more process variables, with the substrate having known initial curvature $C_0(x,y)$ prior to forming the light-emitting device structures thereon;
measuring a curvature $C(x,y)$ of the product wafer after forming the light-emitting device structures thereon, and determining a change in curvature $\Delta C(x,y) = C(x,y) - C_0(x,y)$;
associating an emission wavelength $\lambda_E$ of the light-emitting device structures with the calculated wafer curvature $C(x,y,)$ based on a relationship between the calculated curvature $C(x,y)$ and $(x,y)$ positions of the light-emitting device structures on the product wafer; and
comparing the emission wavelength $\lambda_E$ to an emission-wavelength variation tolerance to determine which light-emitting structures can be used to form a light-emitting device.

* * * * *